United States Patent [19]
Carlson et al.

[11] Patent Number: 5,490,509
[45] Date of Patent: Feb. 13, 1996

[54] METHOD AND APPARATUS FOR MRI USING SELECTIVELY SHAPED IMAGE VOLUME OF HOMOGENEOUS NMR POLARIZING FIELD

[75] Inventors: Joseph W. Carlson, Kensington; Leon Kaufman, San Francisco, both of Calif.

[73] Assignee: The Regents of the University of California, Oakland, Calif.

[21] Appl. No.: 33,552

[22] Filed: Mar. 18, 1993

[51] Int. Cl.$^6$ .................................................. A61B 5/055
[52] U.S. Cl. .................... 128/653.2; 324/318; 324/309
[58] Field of Search ............................ 128/653.2, 653.5; 324/318, 322, 309, 320

[56] References Cited

U.S. PATENT DOCUMENTS

| | | | |
|---|---|---|---|
| 4,631,481 | 12/1986 | Young et al. | 324/318 |
| 4,680,551 | 7/1987 | O'Donnell et al. | 324/318 |
| 4,740,753 | 4/1988 | Glover et al. | 324/320 |
| 4,829,252 | 5/1989 | Kaufman . | |
| 4,878,022 | 10/1989 | Carlson | 324/322 |
| 4,899,109 | 2/1990 | Tropp et al. | 324/320 |
| 4,980,641 | 12/1990 | Breneman et al. | 324/318 |
| 4,983,922 | 1/1991 | Tahara | 324/318 |
| 4,990,877 | 2/1991 | Benesch | 324/318 |
| 5,006,804 | 4/1991 | Dorri et al. | 324/320 |
| 5,057,778 | 10/1991 | Rath | 324/318 |
| 5,173,661 | 12/1992 | Knüttel et al. | 324/309 |
| 5,343,151 | 8/1994 | Cory et al. | 324/320 |
| 5,359,289 | 10/1994 | Van Der Meulen | 324/320 |
| 5,371,465 | 12/1994 | Onodera et al. | 324/309 |

FOREIGN PATENT DOCUMENTS

| | | |
|---|---|---|
| 0217520 | 4/1987 | European Pat. Off. . |
| 884129 | 12/1961 | United Kingdom . |

Primary Examiner—William E. Kamm
Assistant Examiner—Brian L. Casler
Attorney, Agent, or Firm—Nixon & Vanderhye

[57] ABSTRACT

An electromagnet shim coil is utilized for temporarily altering the shape of a volume in which there is provided a substantially homogeneous NMR polarizing field. By temporarily energizing the electromagnet shim coil and thus altering the shape of the volume, magnetic resonance imaging can take place in other than a substantially spherical volume (e.g., in an elongated ellipsoidal-like volume extending axially along a patient so as to encompass a longer section of the spinal column). In the exemplary embodiment, the electromagnet shim coil takes the form of a pancake-like coil with windings positioned so as to create fourth power spherical harmonic in a transverse magnet-type of MRI system.

20 Claims, 4 Drawing Sheets

SHIM CORRECTION PROPORTIONAL TO
$(x^2 - y^2)(6z^2 - x^2 - y^2)$

METHOD AND APPARATUS FOR MRI USING SELECTIVELY SHAPED IMAGE VOLUME OF HOMOGENEOUS NMR POLARIZING FIELD

BACKGROUND OF THE INVENTION

1. Field of the Invention

This invention relates generally to magnetic resonance imaging (MRI) which employs nuclear magnetic resonance (NMR) phenomena. The invention is particularly directed to method and apparatus for maintaining the requisite homogeneous NMR polarizing magnetic filed $B_o$ within an altered volumetric shape thus facilitating MRI within non-spheroidal image volumes. In effect, the invention utilizes adaptive main magnet shimming for MRI.

2. Description of Prior Art

MRI is by now a well known and commercially available non-invasive procedure for obtaining diagnostic information about the internal structure of living tissue. In very brief summary, NMR nuclei (e.g., a significant proportion of hydrogen nuclei in the human body) are nominally aligned with an intense superimposed static homogeneous magnetic field $B_o$. By applying predetermined sequences of NMR RF nutation pulses and magnetic gradient pulses of selected duration and in selected directions (e.g., to selectively cause transient gradients in the $B_o$ magnetic field along the usual orthogonal X,Y,Z coordinate directions), some of these nuclei are disturbed in a predetermined manner from their quiescent orientations. As they tend to return to the quiescent orientation with $B_o$, they emit characteristic spatially encoded RF signals which are detected, digitized and processed in known ways to produce a visual image representing the distribution of NMR nuclei (e.g., along the selected planar "slice" of volumes of living tissues within a predetermined image volume).

In conventional commercially available MRI systems, different geometries and coordinate systems are used to practice MRI. For example, one common arrangement uses a solenoidal cryogenic super-conducting electromagnet to produce the nominally static homogeneous quiescent magnetic field $B_o$ along a Z axis centered within the bore of the solenoid. Another arrangement uses an array of permanent magnets and magnetic circuit yokes between enlarged transverse pole pieces disposed above and below the image volume. In whole-body MRI systems, the dimensions of the main magnet and of the associated gradient coils (and some RF coils) utilize relatively large scale geometry for a number of reasons. First of all, the system must be large enough to accommodate a human body (or at least the portion of the human body that is to be imaged). But, perhaps even more importantly, relatively large geometries are utilized to obtain the required uniformity, linearity and/or reproducibility of magnetic fields within the image volume, the image volume itself comprising a relatively small and limited portion of the entire volume bounded by such structures.

While the actually imaged volume may depend upon a number of factors (e.g., the volumetric space to which the RF coils are coupled), it is necessarily limited in potential size to the volume in which the main magnet is capable of providing a substantially homogeneous NMR polarizing field $B_o$. This is so because the ability of depends on the homogeneity of the static magnetic field $B_o$ MRI to provide a spatially accurate image of anatomy as well as the linearity of the magnetic gradient coils. Typical commercial MRI systems are designed so as to produce the requisite magnetic field homogeneity and gradient coil linearity over a generally spherical volume of approximately 40 cm diameter.

The linearity of the magnetic gradient coils can be improved substantially through a series of well known procedures for creating higher order corrections to the gradient coil field. Generally, however, linearities on the order of even 1% provide sufficient linearity for most human tissue imaging.

The requirement of homogeneity for the background or polarizing NMR field $B_o$ is a more exacting constraint. Typically, commercial MRI systems require homogeneity on the order of 20 to 50 parts per million throughout the potential imaging volume before possible inhomogeneity artifacts can be substantially disregarded (at least with current commercially available MRI processes). Using standard main magnet MRI technology and shimming techniques, the required homogeneity is achievable with a relatively modest effort (in many cases). However, improvements beyond the existing acceptable levels of homogeneity and/or maximum potential imaging volumes encounter significant difficulty. For example, if one wishes to increase the potential imaging volume (e.g., by increasing the diameter of the suitably shimmed spherical volume of homogeneity), there is soon encountered the very difficult problem of providing suitably increased magnet shimming regions.

Conventional main magnet shimming (which may include an electromagnet shim coil) so as to produce spherical volumes of substantially homogeneous polarizing field $B_o$ are realistic for most imaging situations involving heads, extremities or abdominal regions. However, for certain imaging procedures (most notably of the spine), it would be of considerable benefit to provide an ellipsoidally shaped volume of homogeneous NMR polarizing field. In this way, in conjunction with suitably dimensioned RF surface coils or the like, a greater length of the spine might be imaged in a single MRI data acquisition sequence.

BRIEF SUMMARY OF THE INVENTION

We have now discovered a way of selectively achieving more nearly optimized volumetric shapes for the homogeneous MRI polarizing field depending upon the MRI situation at hand (e.g., spherical for heads, and the like and ellipsoidal for spinal columns and perhaps other elongated portions of the body anatomy). In particular, we have discovered that it is possible to permit the MRI system operator to switch between a spherically shimmed volume and an ellipsoidally shimmed volume (e.g., by energizing or not energizing an additional electromagnet shim coil). This makes the MRI system better suited for both generally spherical regions of heads and abdomens as well as ellipsoidal regions of spines for which an elongated homogeneously shimmed $B_0$ volume is desirable.

In accordance with our invention, MRI may be performed by first temporarily altering the shape of a volume in which there is provided a substantially homogeneous NMR polarizing field and thereafter performing MRI to acquire image data for objects located within that altered volume shape. Preferably, when current is passed through the windings of an electromagnet shim coil, it is disposed so as to elongate the volume of substantially homogeneous polarizing field along the longitudinal axis of the patient being imaged. It is particularly suitable for this purpose to use a surface RF coil (suitably elongated if necessary) placed adjacent a portion of the patient's spinal column along which the potential image volume has thus been extended.

The MRI system for practicing our invention includes at least one electromagnet shim coil which, when energized, is capable of altering the shape of a volume in which there is provided a substantially homogeneous NMR polarizing field. Of course, the usual NMR data acquisition apparatus is thereafter utilized for acquiring image data for objects located within the volume of altered shape. The MRI data acquisition apparatus, in a preferred embodiment, includes an elongated (if required) RF surface coil adapted for location adjacent a portion of the patient's spinal column along which the image volume has been extended by energizing the electromagnet shim coil.

The present exemplary embodiment is designed for use in a transverse magnet type of MRI system where the magnetic shim coil is of substantially flat pancake-like structure and including a plurality of conductive turns with right angles disposed symmetrically in each of four quadrants. The overall shim coil is of circular cross-section and, in a preferred embodiment, includes a similar pancake-like coil disposed in association with the switched magnetic gradient coils at each pole of the transverse main magnet.

In this present exemplary embodiment, each quadrant of the magnetic shim coil includes one right-angled conductor passing in proximity to intersecting diameters of the coil wherein currents in each such right-angled conductor of one quadrant are directed in the same direction as currents in the most proximate similar right-angled conductor of the adjacent quadrant. This exemplary embodiment further includes five right-angled further conductors spaced from, but substantially parallel to the first-mentioned right-angled conductors of each quadrant. The currents in these further five conductors are all in a direction opposite to that of current passing in the first-mentioned right-angled conductor of that quadrant. In the exemplary embodiment, the pair of shim coils (one at each transverse magnet pole) is separated from each other by approximately 60 cm, each coil having a diameter of approximately 140 cm. The further right-angled conductors are separated from the first-mentioned right-angled conductors within each quadrant by approximately 17.5 cm. These specific dimensions have been arrived at by iterative computer simulations so as to maximize homogeneity over the desired approximately ellipsoidal shaped volume.

In the exemplary embodiment, a main magnet produces the usual substantially homogenous polarizing field $B_o$ within an approximately spherical MR image volume. However, a shim electromagnet is capable of altering the polarizing field $B_o$ when energized so as to produce a substantially non-spherical potential MR image volume. A switchable power supply is connected to the shim electromagnet for selectively activating it and thus providing the non-spherical potential MR image volume for selected MRI processes (e.g., spinal MRI studies).

The shim electromagnet in the exemplary embodiment includes windings shaped so as to produce fields having a spatial distribution which is proportional to a fourth power spherical harmonic and thus to alter the shape of the volume in which a substantially homogeneous polarizing field is provided by elongating it in one dimension (while reducing its dimensions in at least one other direction).

BRIEF DESCRIPTION OF THE DRAWINGS

These, as well as other objects and advantages of this invention, will be more completely understood and appreciated by careful study of the following more detailed description of a presently preferred exemplary embodiment of the invention taken in conjunction with the accompanying drawings, of which.

DETAILED DESCRIPTION OF THE EXEMPLARY EMBODIMENTS

Figure 1:
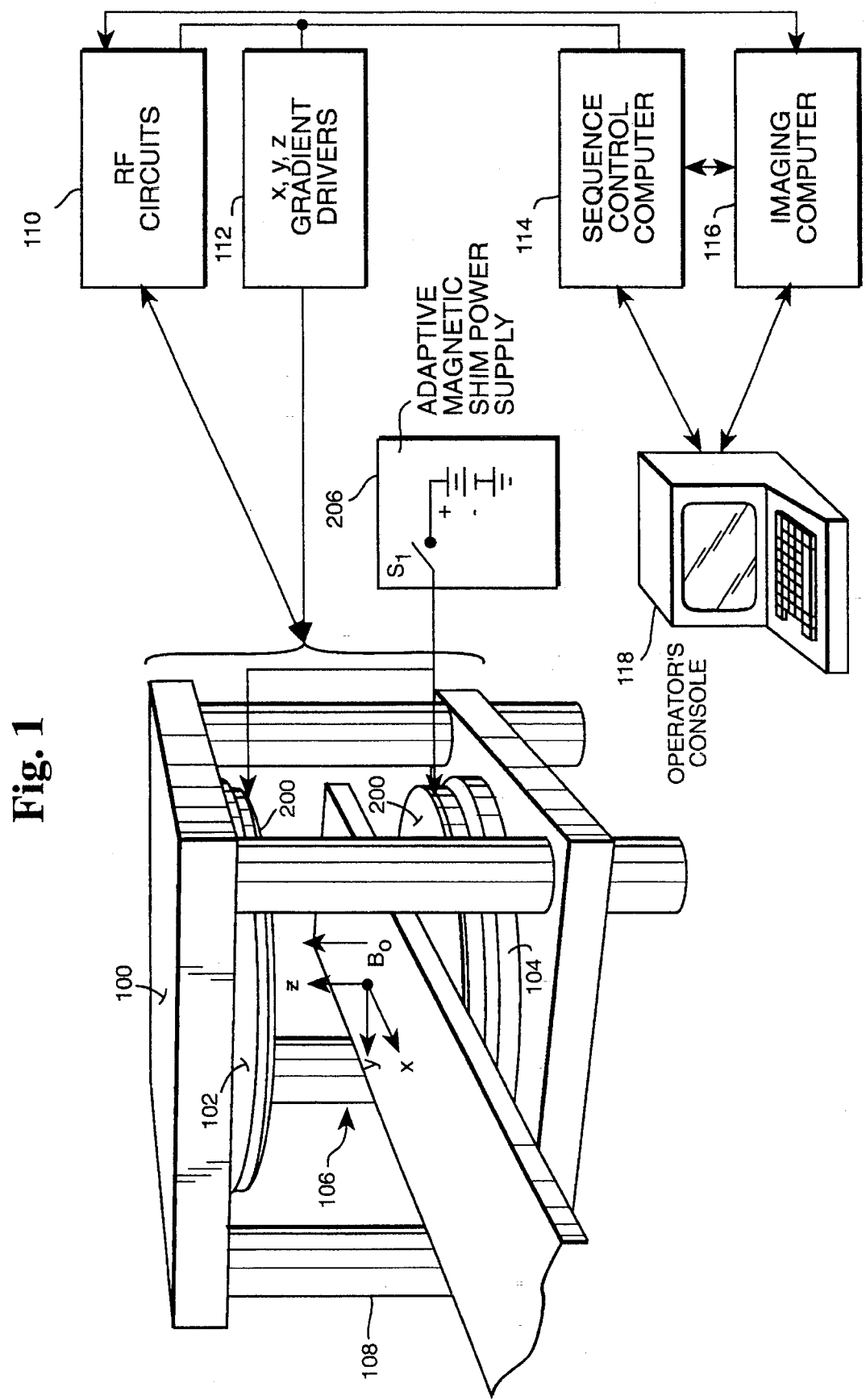
FIG. 1 is a schematic diagram of a modified transverse magnet MRI system incorporating a switched adaptive magnetic shim coil in accordance with this invention.

The transverse magnetic MRI system schematically depicted in FIG. 1 may be in many respects conventional. For example, the usual main magnet having transverse poles 102, 104 on opposite sides of an image volume 106 located therebetween includes the usual massive return flux yokes 108 and other associated structures as will be familiar to those in the art. The usual RF subsystem circuits 110 and X,Y,Z gradient drivers 112 are controlled by sequence control computer subsystem 114 to produce MRI data acquisition sequences of NMR RF nutation pulses and magnetic gradient pulses utilizing magnetic gradient coils and RF coils suitably adapted and disposed for MRI. The return NMR RF signals are received via RF circuits 110 and passed to imaging computer subsystem 116 and conventionally processed so as to produce a visual image of the spatial distribution of NMR nuclei within the image volume 106. Operator's console 118 is provided for the usual operator control of the sequence control computer 114 and imaging computer 116. As those in the art will appreciate, the showing in FIG. 1 is extremely abbreviated and simplified should be well within the ordinary understanding and abilities of those skilled in the art.

In addition to the usual MRI system components, FIG. 1 also includes a simplified diagrammatic depiction of a pair of special electromagnetic shim coils 200, one being disposed at each transverse magnet pole 102, 104 as part of the gradient coil "stack" 202. This "stack" of electromagnet coils is diagrammatically depicted in exploded view at FIG. 2 as including the usual X,Y,Z gradient coils disposed within an annular Rose shim 204 (used in conjunction with the permanent magnet pole 206 to obtain a nominally spherical volume of substantially homogeneous NMR polarizing field $B_o$).

Figure 2:
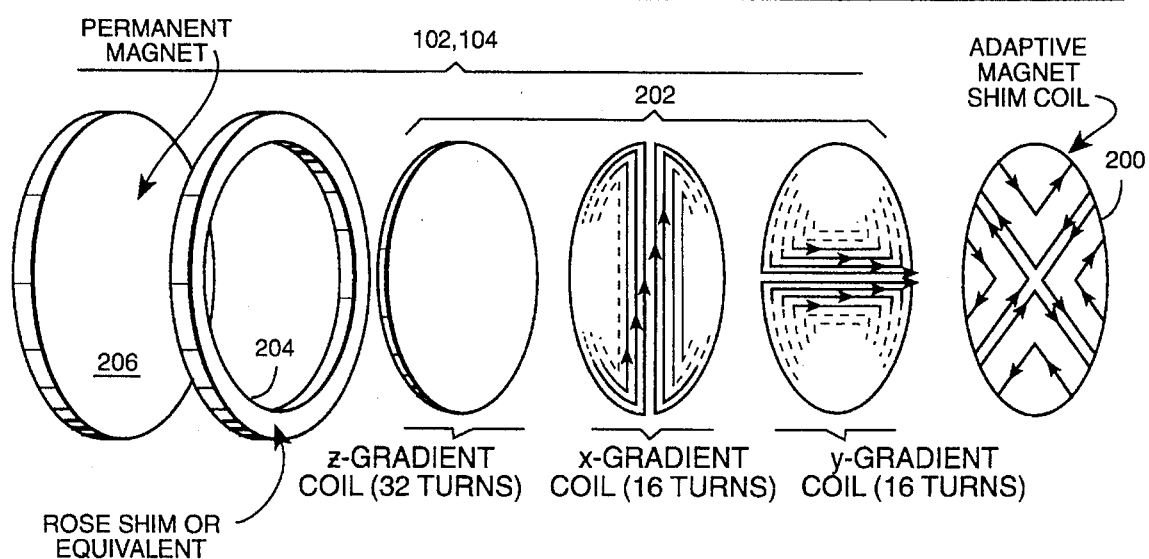
FIG. 2 is an exploded diagrammatic view of one of the magnet poles in the exemplary embodiment of FIG. 1 including gradient coils as well as the adaptive magnetic shim coil.
Figure 3:
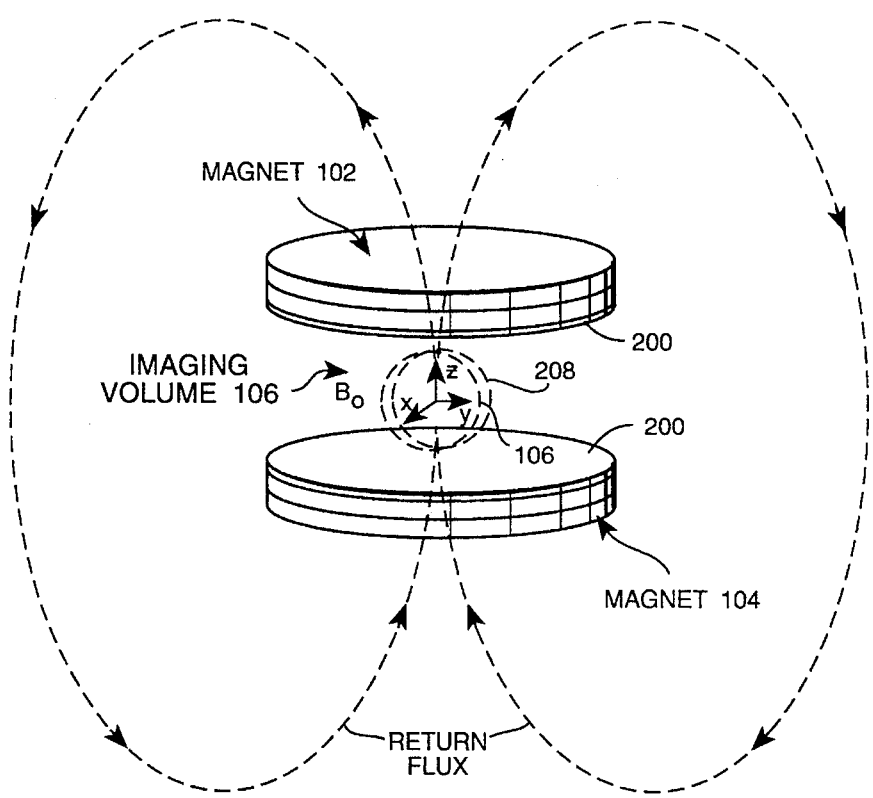
FIG. 3 is a partial schematic view of the transverse magnet poles, gradient coils and adaptive shim of FIG. 1.
Figure 4A:
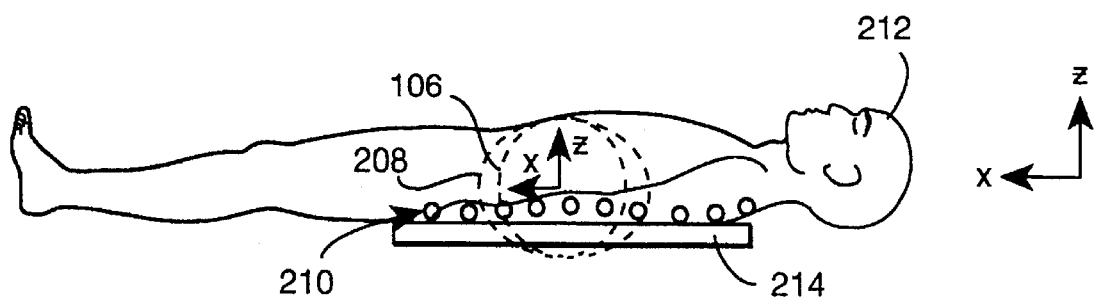
FIGS. 4A and 4B are schematic diagrams (elevational and plan views respectively) depicting the usual nominal spherical image volume as well as its altered shape when the conductor winding paths utilized in the adaptive shim coil is energized in conjunction with a spinal MRI procedure.
Figure 4B:
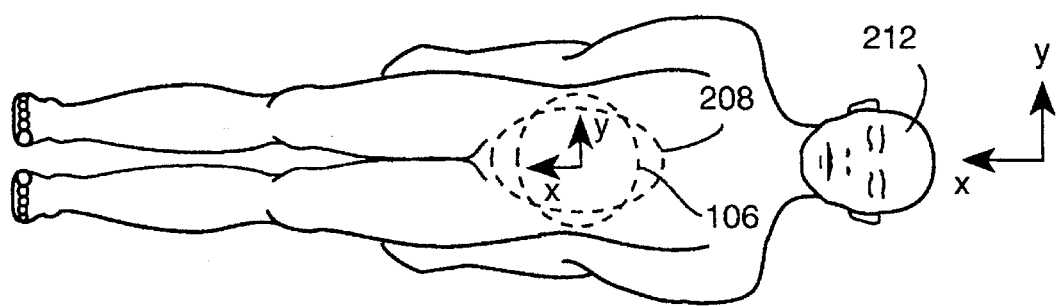

In addition, as depicted in more detail at FIG. 2, the gradient coil stack is extended (actually the adaptive magnetic shim coil 200 and can be included anywhere within the gradient coil stack if desired) so as to include an extra adaptive magnetic shim coil which, when energized, alters the shape of the volume in which there is provided a substantially homogeneous NMR polarizing field (e.g., to a substantially ellipsoidal shape). Accordingly, when the adaptive shim power supply 206 is activated (e.g., by manual closure of switch S1 or by programmed closure of an electronic switch via sequence control computer 114 or otherwise as commanded from the operator console 118), the usual spherical potential image volume 106 is altered into an elongated potential image volume 208 extending along the longitudinal X axis of a patient's body (e.g., as schematically depicted in FIG. 3). Accordingly, a greater portion of the elongated spinal column 210 of patient 212 is now included within the potential image volume 208. By employing a suitably elongated (if necessary) RF surface coil 214 in conjunction with the spinal column 210, this elongated potential image volume can be used to advantage in an MRI process. For conventional MRI processes where the spherical potential image volume 106 is better suited, the adaptive magnetic shim power supply 206 is disengaged (e.g., by opening switch S1). It may be appreciated that energizing power for the adaptive magnetic shims 200 may be obtained from a driving circuit similar to the gradient drivers 112—albeit such driver would be constantly turned "on" throughout an MRI spinal column study, for example.

In the design of magnetic coils for MRI systems, the static field distribution within the image volume created by a magnetic structure may be described as a linear combination of certain spherical harmonics. For example, the first term in such a representation would be the zero term representing a constant or DC component. There are three potential linear gradient spherical harmonic components, five potential quadratic components, seven potential cubic components, nine potential fourth power components and so forth. As will be realized by those in the art, all of the potential spherical harmonics represent realizable static magnetic fields in real world environments. In the design of the usual static magnetic field generator, the linear and higher order spherical harmonics are suppressed to the greatest degree possible so as to leave only the desired constant and residual components. As will be explained in more detail below, the adaptive magnetic shim coil of the exemplary embodiment purposely attempts to generate a certain fourth power spherical harmonic component to purposely reshape the potential image volume of the static polarizing field in which there is a substantially homogeneous NMR polarizing field $B_o$.

Unfortunately, if one merely attempts to increase the size of the usual spherical potential image volume, one runs into essentially insurmountable difficulties. However, we have discovered that if one is willing to relinquish homogeneity in one or two dimensions, then it is possible to obtain improved homogeneity in a third dimension.

The exemplary embodiment is adapted for use in the transverse permanent magnet MRI system of FIG. 1. There, the nominally shimmed potential image volume is an approximately 40 cm sphere located at the center of the space between poles 102, 104. The slight inhomogeneity which does exist in this volume is primarily of fourth order, meaning that the inhomogeneity increases as the distance from the origin in proportion to the fourth power of that distance. For explanatory purposes, it will be assumed that the usual X,Y,Z coordinate system is employed with Z being oriented along the vertical axis (in the direction of $B_o$), X being selected to pass parallel to (and preferably co-linear with) the longitudinal axis of the patient and Y being mutually orthogonal in the usual sense (e.g., as depicted in FIGS. 1 and 3). In accordance with this exemplary embodiment, the appropriately shimmed potential image volume of the MRI system can be adjusted by purposely introducing a fourth order electromagnet shim coil which preferentially improves homogeneity in the X direction. Since, for the MRI applications of interest, the same homogeneity specification is no longer required in the transverse directions, the fact that the shim coil may degrade homogeneity in the Y direction is of no concern so long as it is not excessive (albeit it is desirable to keep the homogeneity in the Z direction generally constant).

These general conditions can be approximately satisfied by using a $Y_{42}$ (i.e., one of the possible fourth power spherical components) shim coil which provides a correction proportional to $$(X^2-Y^2)(6Z^2-X^2-Y^2) \qquad \text{[Equation 1]}$$

The general result of this will be to increase field homogeneity along the X axis dimension while decreasing field homogeneity in the Y axis direction. One exemplary embodiment of a coil capable of producing such a fourth order $Y_{42}$ field can be made with conductive wires incorporated into two pancake-like end plates 200 for the magnet poles.

Figure 5:
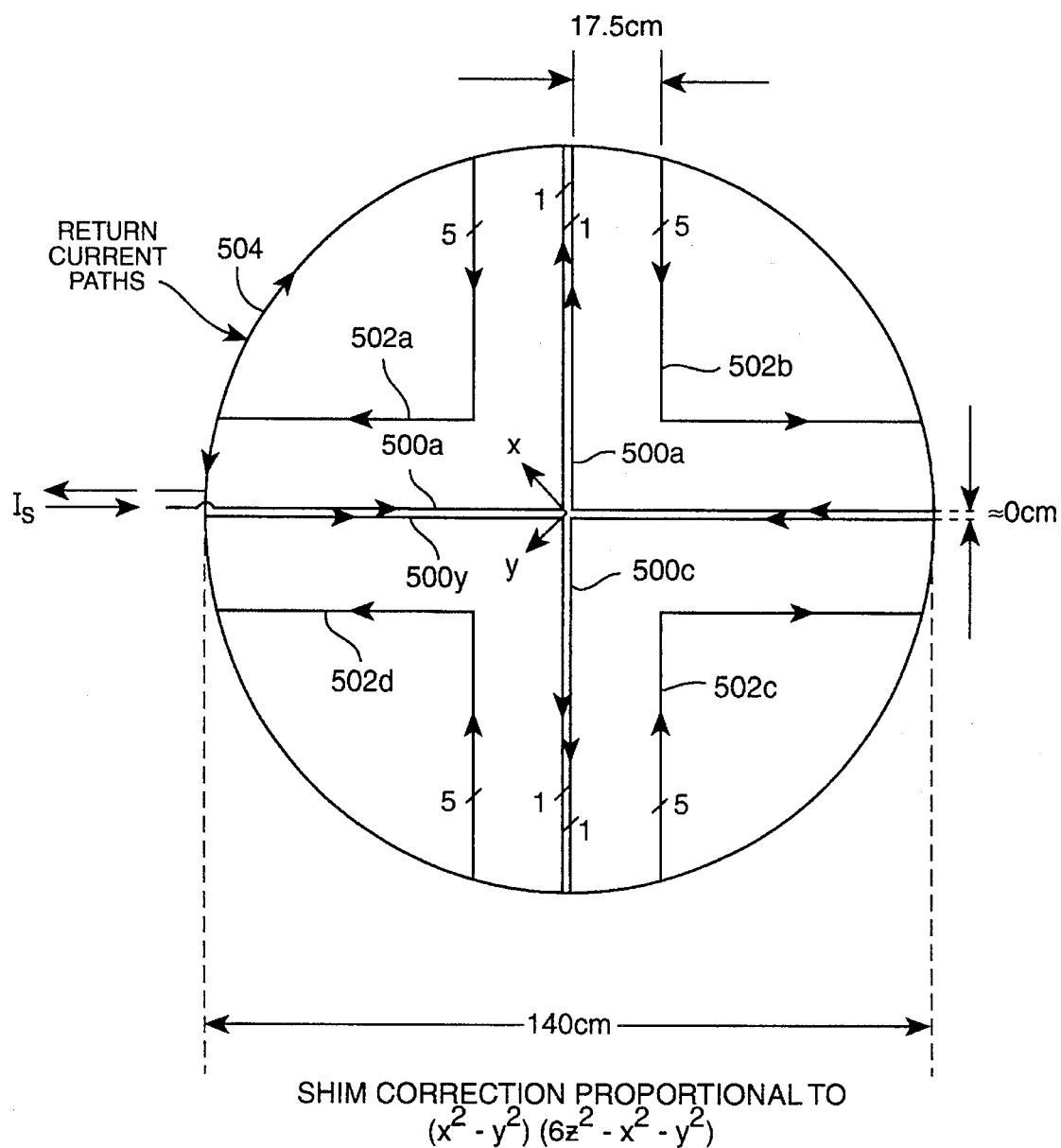
FIG. 5 is a schematic plan view of the adaptive shim coil used in the exemplary embodiment of FIG. 1.

In this exemplary embodiment, each plate has an approximately 140 cm diameter and is separated from the other by approximately 60 cm. The wires are divided into four quadrants as depicted in FIG. 5. In each quadrant, there is a single turn large loop 500 and a five turn smaller loop 502. Current flows in opposing directions along the large loop 500 and small loop 502 respectively as indicated by arrows in FIG. 5. As also depicted in FIG. 5, each of the loops includes a right-angled length of conductor that is parallel to intersecting diameters of the entire coil structure. The large turn right-angled lengths are closely adjacent to each other and to the coil diameters (accommodating, of course, the spacing required for conductor insulation).

"Return" current paths completing the loops 500 and 502 are routed around the circumferential periphery 504. In the exemplary embodiment, all of the turns are connected in series so that there is a single input conductor and a single output conductor for the driving current $I_s$ to this adaptive magnetic shim coil. As depicted by arrows on the periphery 504, various conductors at the periphery may have current going in one direction while other conductors at the same or other points around the periphery may have current flowing in the opposite circumferential direction.

As also depicted for the exemplary embodiment in FIG. 5, the separation between the large right-angled loop wires 500 and the smaller right-angled loop wires 502 within a given quadrant is approximately 17.5 cm. These dimensions and others as depicted in FIG. 5 have been determined by iterative successive approximation computer simulations to provide approximately optimized magnetic field homogeneity within an elongated potential image volume 208 for this particular exemplary MRI system. As those in the art will appreciate, similar evaluations can be made for other geometries and other types of MRI systems so as to produce suitable results.

It is anticipated that the magnitude of current within the shim coil 200 will be less than 10 amps thus making approximately number 10 gauge insulated wire suitable for the windings 500, 502. It is believed that the entire pancake-like winding structure can be contained within an essentially flat, circular package having a thickness less than one inch (e.g., a half inch). As is appreciated in the art, the entire set of windings would preferably be encased within a hardened resin so as to provide a robust unitary structure. As also will be appreciated, such windings could also be incorporated within the gradient coil windings and encapsulated in a common unitary coil former structure as well.

Whereas the traditional spherical potential image volume may be of 40 cm in diameter, the ellipsoidal potential image volume 208 in the exemplary embodiment may be an ellipsoid having approximate dimensions in the X,Y,Z directions of 50 cm ×30 cm ×40 cm.

Although the exemplary embodiment uses two coils symmetrically placed (i.e., one with respect to each of the magnet poles), it is possible that even a single coil might be successfully used in an asymmetric configuration. For example, one such coil might be used with the lower pole piece such that, in conjunction with a surface RF coil, suitable X-axis expansion of the potential image volume may be created along the patient's spinal column in at least the lower part of the potential image volume in any event.

While only one exemplary embodiment of this invention has been described in detail, those skilled in the art will recognize that many variations and modifications may be made in this exemplary embodiment while yet retaining many of the novel features and advantages of this invention. Accordingly, all such modification and variations are intended to be included within the scope of the appended claims.

What is claimed is:

1. A method of performing MRI, said method comprising the steps of:

(a) temporarily altering a dimension of a volume in which there is provided a substantially homogeneous NMR polarizing field so as to reduce the volume of the homogeneous NMR polarizing field in a first direction while simultaneously increasing it in a second different direction; and (b) performing MRI to acquire image data for objects located within said volume of altered dimension.

2. A method of performing MRI as in claim 1 wherein said temporarily altering step (a) comprises:

passing current through windings of an electromagnet shim coil disposed to elongate said volume along the longitudinal axis of a patient being imaged.

3. A method of performing MRI as in claim 2 wherein step (b) comprises using a surface RF coil placed adjacent a portion of the patient's spinal column along which the imaged volume has been extended by the fields produced by the shim coil electromagnet.

4. In an MRI system, the improvement comprising:

(a) at least one electromagnet shim coil which, when energized, alters a dimension of a volume in which there is provided a substantially homogeneous NMR polarizing field; and (b) MRI data acquisition apparatus electromagnetically coupled to said volume and configured for (i) acquiring image data for objects located within said volume of altered dimension while said electromagnet shim coil is energized and (ii) acquiring image data for objects located within a volume of unaltered shape while said electromagnet shim coil is unenergized.

5. An MRI system as in claim 4 wherein said electromagnet shim coil includes means which, when energized, elongates said volume along the longitudinal axis of a patient being imaged.

6. An MRI system as in claim 5 including a surface RF coil adapted to be located adjacent a portion of the patient's spinal column along which the imaged volume has been extended by said electromagnet shim coil.

7. An MRI system comprising:

a main magnet including magnetic shimming for providing a predetermined volume of a substantially homogeneous polarizing magnetic field $B_o$;

at least one magnetic gradient coil magnetically coupled to said volume for providing switched magnetic gradients in said polarizing field at selected times in an MRI data acquisition sequence;

at least one RF coil electromagnetically coupled to said volume and coupling NMR RF signals into and/or out of imaged patient tissue located in said homogeneous polarizing field; and at least one selectively activated electromagnet shim coil also magnetically coupled to said volume and which alters a dimension of the volume of the homogeneous polarizing field when energized so as to reduce the volume of the homogeneous polarizing field in a first direction while simultaneously increasing it in a second different direction.

8. An MRI system comprising:

a main magnet providing a predetermined volume of a substantially homogeneous polarizing magnetic field $B_o$;

at least one magnetic gradient coil magnetically coupled to said volume and providing switched magnetic gradients in said polarizing field at selected times in an MRI data acquisition sequence;

at least one RF coil electromagnetically coupled to said volume and coupling NMR RF signals into and/or out of imaged patient tissue located in said homogeneous polarizing field; and at least one selectively activatable magnetic shim coil also magnetically coupled to said volume and which alters a dimension of the volume of the homogeneous polarizing field when activated;

wherein said magnetic shim coil includes a plurality of conductive turns with right angles disposed symmetrically in each of four quadrants.

9. An MRI system as in claim 8 wherein said magnetic shim coil is contained within a substantially flat pancake-like structure of approximately circular cross section.

10. An MRI system as in claim 9 wherein each quadrant of said magnetic shim coil includes a first right-angled conductor passing in proximity to intersecting diameters of the coil, currents in each such conductor being directed in the same direction as current in the most proximate conductor of the adjacent quadrant.

11. An MRI system as in claim 10 wherein each quadrant of said magnetic shim coil includes five right-angled further conductors spaced from but substantially parallel to the first right-angled conductor of the quadrant, currents in said further conductors all being opposite in direction to the current passing in the first right-angled conductor of the quadrant.

12. An MRI system as in claim 11 wherein:

said main magnet is a transverse magnet having opposed transverse poles;

one of said magnetic shim coils being disposed parallel to each said pole and separated by approximately 60 cm;

each said shim coil having a diameter of approximately 140 cm; and said further right-angle conductors being separated from the first right-angled conductor of their respective quadrant by approximately 17.5 cm.

13. An MRI system having a main magnet producing a substantially homogeneous polarizing field $B_o$ within an approximately spherical MR image volume, said system comprising:

MRI RF signal transmitting and receiving circuits electromagnetically coupled to said image volume;

a shim electromagnet which alters the polarizing field $B_o$ when energized to produce a substantially non-spherical MR image volume; and a switchable power supply connected to said shim electromagnet for selectively activating said shim electromagnet and thus providing said non-spherical MR image volume for selected MRI processes.

14. An MRI system having a main magnet producing a substantially homogeneous polarizing field $B_o$ within an approximately spherical MR image volume, said system comprising:

MRI RF signal transmitting and receiving circuits electromagnetically coupled to said image volume;

a shim electromagnet which alters the polarizing field $B_o$ when energized to produce a substantially non-spherical MR image volume; and a switchable power supply connected to said shim electromagnet for selectively activating said shim electromagnet and thus providing said non-spherical MR image volume for selected MRI processes;

wherein said shim electromagnet includes windings shaped to produce fields having a spatial distribution proportional to a fourth power spherical harmonic.

15. An MRI system having a main magnet producing a substantially homogeneous polarizing field $B_o$ within an approximately spherical MR image volume, said system comprising:

MRI RF signal transmitting and receiving circuits electromagnetically coupled to said image volume;

a shim electromagnet which alters the polarizing field $B_o$ when energized to produce a substantially non-spherical MR image volume; and a switchable power supply connected to said shim electromagnet for selectively activating it and thus providing said non-spherical MR image volume for selected MRI processes;

wherein said main magnet comprises transverse magnet poles and said shim electromagnet includes a substantially flat circular pancake-like structure disposed near at least one said pole and having four symmetrical quadrants of windings therewithin.

16. An MRI system as in claim 15 wherein, each said quadrant of windings includes a first right-angle winding disposed parallel to intersecting diameters of the circular structure and a plurality of second right-angle windings spaced radially outwardly of said first winding and parallel thereto.

17. An MRI system as in claim 16 wherein, said plural second right-angle windings are of substantially the same dimensions and substantially co-located within each quadrant.

18. An MRI system as in claim 17 having five of said second windings in each quadrant.

19. An MRI system as in claim 16 wherein all said windings are serially connected with each other and wherein return conductors and interconnecting conductors for the windings are routed in proximity to an outer circumference of said pancake-like structure.

20. An MRI system as in claim 15 comprising a pair of said pancake-like structures, one disposed near each pole of the main magnet.

* * * * *